(12) United States Patent
Brandt

(10) Patent No.: US 7,330,072 B2
(45) Date of Patent: Feb. 12, 2008

(54) CIRCUIT FOR POWER AMPLIFICATION

(75) Inventor: Per-Olof Brandt, Lomma (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 236 days.

(21) Appl. No.: 10/522,913

(22) PCT Filed: Jul. 21, 2003

(86) PCT No.: PCT/EP03/07948

§ 371 (c)(1),
(2), (4) Date: Sep. 9, 2005

(87) PCT Pub. No.: WO2004/013957

PCT Pub. Date: Feb. 12, 2004

(65) Prior Publication Data

US 2006/0066396 A1    Mar. 30, 2006

Related U.S. Application Data

(60) Provisional application No. 60/400,561, filed on Aug. 2, 2002.

(30) Foreign Application Priority Data

Aug. 1, 2002   (EP)   ................................ 02255396

(51) Int. Cl.
*H03Q 5/16*   (2006.01)

(52) U.S. Cl. .................. 330/133; 330/296; 330/207 P

(58) Field of Classification Search ................ 330/133, 330/207 P, 296
See application file for complete search history.

(56) References Cited

U.S. PATENT DOCUMENTS

| | | | |
|---|---|---|---|
| 3,671,878 A * | 6/1972 | Becker | ........................ 330/298 |
| 4,924,191 A | 5/1990 | Erb et al. | |
| 5,331,291 A * | 7/1994 | D'Agostino et al. | ........ 330/289 |
| 5,426,641 A | 6/1995 | Afrashteh et al. | |
| 5,455,968 A | 10/1995 | Pham | |
| 5,673,001 A * | 9/1997 | Kim et al. | .................. 330/284 |
| 6,043,707 A | 3/2000 | Budnik | |
| 6,137,354 A * | 10/2000 | Dacus et al. | .................. 330/51 |

FOREIGN PATENT DOCUMENTS

JP       11284522       10/1999

* cited by examiner

Primary Examiner—Patricia Nguyen
(74) Attorney, Agent, or Firm—Michael Cameron

(57) ABSTRACT

A radio frequency (RF) power amplifier, including an external control loop and a protection circuit, which functions to maintain a constant output power during variations in impedance on the RF load. In the external control loop a collector current from an output transistor is detected and then regulated with respect to a reference current. The regulated signal is utilised to generate a bias control signal which is input to the base electrode of both a driver transistor and the output transistor. The protection circuit detects a voltage envelope at the collector electrode of the output transistor and utilises this signal to form a bias reduction signal which is input to the base electrode of the driver transistor.

9 Claims, 4 Drawing Sheets

CIRCUIT FOR POWER AMPLIFICATION

This patent application claims the benefit of priority from U.S. Provisional Patent Application Ser. No. 60/400,561 filed on Aug. 2, 2002. This application incorporates by reference the entire disclosure of U.S. Provisional Patent Application Ser. No. 60/400,561.

TECHNICAL FIELD OF THE INVENTION

The present invention relates to a power control circuit and method, and in particular to the control of output power of a high frequency power amplifier.

DESCRIPTION OF THE RELATED ART

In modern telecommunication systems, radio frequency (RF) power amplifiers are used to control output power of mobile devices (such as cellular telephones, cordless telephones, two-way pagers, wireless LAN, AM/FM analogue transmitters) prior to, and during, signal transmission. These RF power amplifiers typically generate an output power in the range of 50 mW to 3 W. Known RF power amplifiers can control output power at a RF load (which is generally an antenna) via biasing an output transistor.

Generally in RF power amplifiers, impedance at the output transistor must match the nominal impedance of the load in order to avoid problems such as unwanted standing waves (resulting from signal reflection at the load) in the apparatus. Efficient antenna operation requires that the antenna is matched to the circuit service, to ensure maximum energy transfer. The quality of system matching is measured in terms of a parameter known as voltage standing wave ratio (VSWR). This parameter can be determined for frequencies at which a particular system operates. Optimum operation in a RF power amplifier requires a 1:1 VSWR at all relevant frequencies. Unfortunately, many conventional antennas exhibit a high VSWR (for example, greater than 3:1) which adversely affects efficiency, especially in wideband antennas, unless some form of compensatory matching network is used. Use of such compensatory matching networks is undesirable because they tend to decrease transmission power available and slow the operation of the system.

The impedance of a load such as an antenna varies with motion and position and thus, impedance variation is common for mobile devices. The impedance variation results in a voltage swing across the collector electrode of the output transistor of the RF power amplifier. For example, a RF power amplifier driving a cellular telephone antenna with 50 Ohms nominal impedance may, at times, be required to drive a high output transistor impedance, which could lead to a VSWR as high as 20:1.

Substantially mismatched loads (and hence a high VSWR) can lead to a degradation of the RF power amplifier. This degradation, or even transistor failure, occurs as a result of exceeding the collector-emitter voltage and collector current that can safely be applied to a bipolar transistor (here, the output transistor) within the constraints of the 'secondary breakdown' effect.

The output transistor is not able to draw d.c. current (as a capacitor is used to remove the d.c. component) and so the output bias circuitry provides increased bias current, which leads to increased input power to the output transistor. Where a system is experiencing high VSWR and high load impedance, and hence a large voltage swing at the collector electrode of the output transistor, it is possible that negative gain can occur in the output amplifier.

U.S. Pat. No. 5,455,968(Pham) discloses a variable power amplifier including a final stage amplification element. This element is coupled to a bias network which aims to provide stability where output mismatch conditions exceed 5:1 VSWR.

Japanese Patent JP 11284522 describes a system to maintain constant output power in a high frequency power amplifier. An output signal of a second amplifier is detected, processed and input to a first amplifier. The system involves the use of a directional coupler.

Therefore, it can be seen that it is desirable to control output power of an RF power amplifier where the impedance of the load is varying.

SUMMARY

According to a first aspect of the present invention, there is provided a method of controlling output from a power amplifier which has a driver stage and an output stage, the method comprising detecting a first and a second electrical parameter at an output of the output stage; processing the first parameter with a first reference signal to generate a bias control signal; processing the second parameter with a second reference signal to generate a bias reduction signal; feeding the bias control signal to an input of both the driver and the output stages, and feeding the bias reduction signal to an input of the driver stage.

According to a second aspect of the present invention there is provided an electrical circuit comprising a power amplifier, an external control loop and a protection circuit; wherein the protection circuit comprises detection means for detecting an electrical parameter at an output of the power amplifier, bias reduction means for providing a bias signal at an input of the power amplifier and a reference signal generator coupled to the bias reduction means.

The power amplification circuit as described above can be utilised in a mobile telecommunications device.

Advantageously, the present invention mitigates problems associated with output power control in the prior art. Also, low voltage transistors (and other low voltage technologies) can be used and the invention be implemented on an integrated circuit using a minimum of components. Where high output mismatch conditions result in the circuit experiencing a high VSWR, the present invention functions to reduce the circuit output power variation.

Further advantage is obtained in that both the driver transistor and output transistor are protected from excessive voltage levels.

It is emphasised that the term 'comprises' or 'comprising' is used in this specification to specify the presence of stated features, integers, steps or components, but does not preclude the addition of one or more further features, integers, steps or components, or groups thereof.

DETAILED DESCRIPTION OF THE EMBODIMENTS

Figure 1:
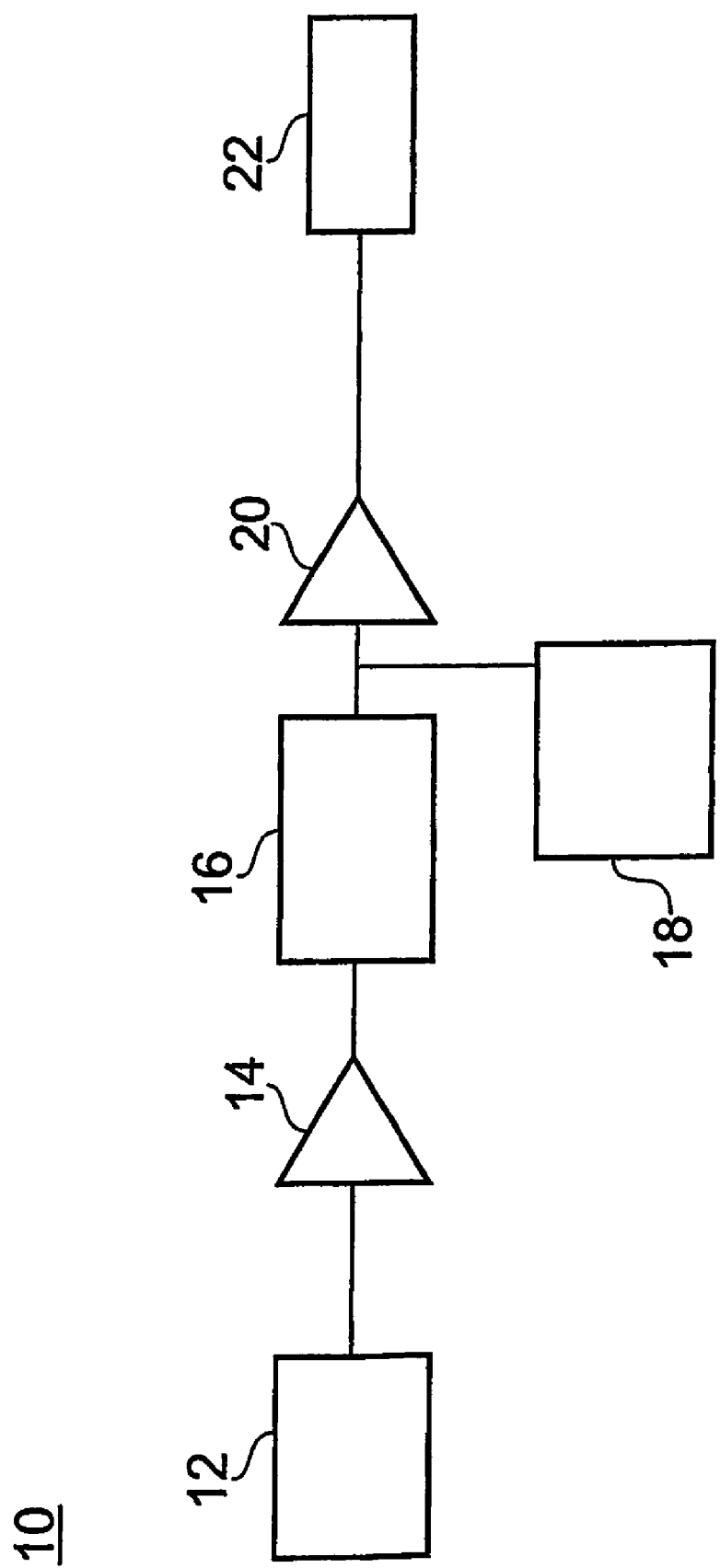
FIG. 1 is a schematic diagram of a RF power amplifier.

FIG. 1 illustrates a RF power amplifier 10, in which a RF signal 12 is input to a driver transistor 14. The collector electrode of the driver transistor 14 is coupled to a capacitor 16, which, in turn is coupled to an output transistor 20. An output bias circuitry 18 is coupled to the base electrode of the output transistor 20. Finally, the collector electrode of the output transistor 20 is coupled to a RF load 22. Generally, the RF load 22 is an antenna.

In operation, the RF signal 12 is amplified by the driver transistor 14, and the capacitor 16 serves to remove any d.c. component (leaving only the a.c. component) of the amplified signal before it is input to the output transistor 20. An approximately constant bias current is output from the output bias circuitry 18 and functions to bias the output transistor 20 such that the output transistor collector current is controlled.

The capacitor 16 functions to match impedance in the circuit and can be replaced by any suitable impedance matching element.

Figure 2:
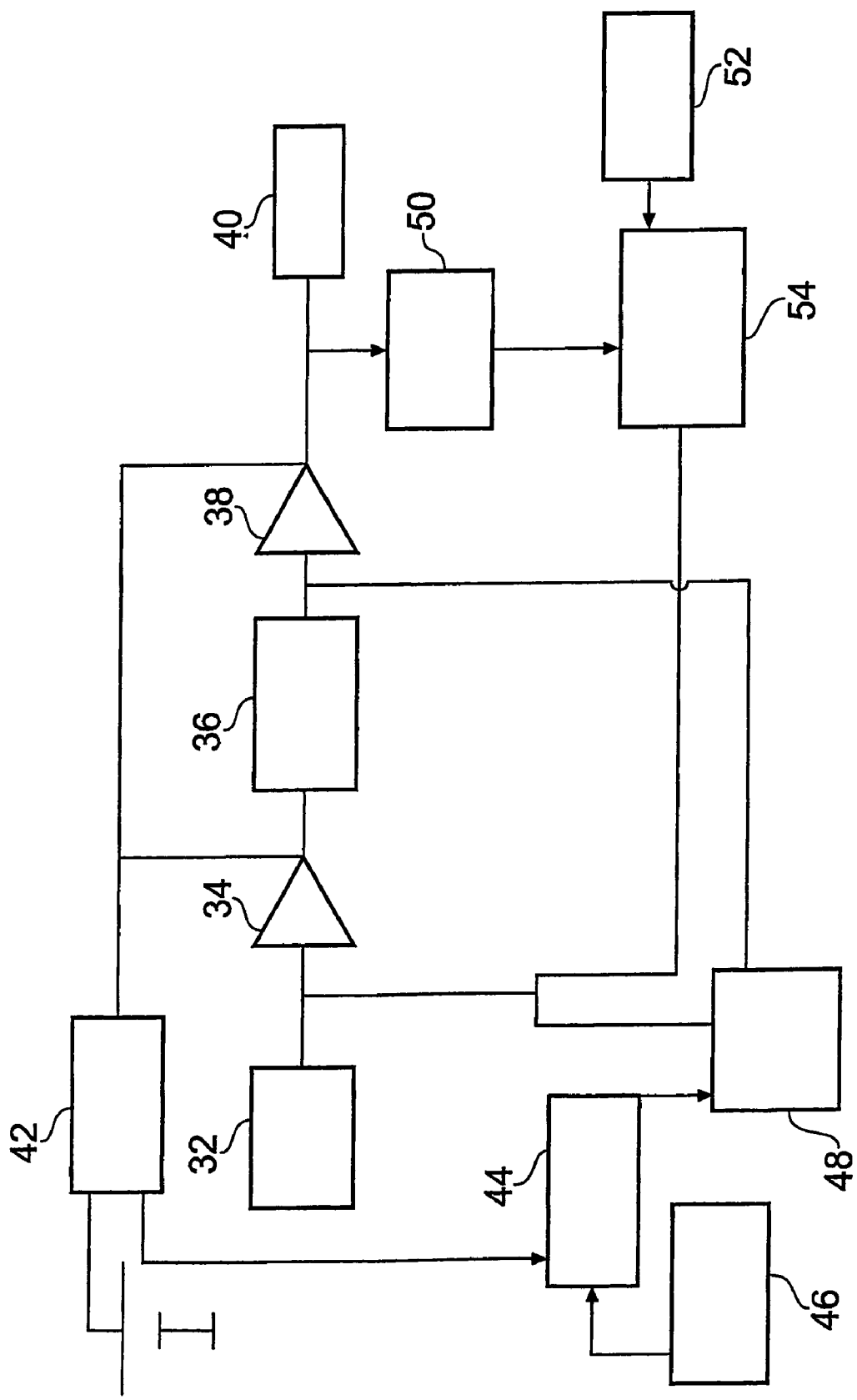
FIG. 2 is a schematic diagram of a RF power amplifier in accordance with an embodiment of the invention.

In FIG. 2, a RF power amplifier is coupled to an external control loop and a protection circuit. Specifically, in the RF power amplifier a RF signal 32 is input to a driver transistor 34. The collector electrode of the driver transistor 34 is coupled to a capacitor 36 which, in turn is coupled to an output transistor 38. A collector electrode of the output transistor 38 is coupled to a RF load 40 (which is generally an antenna).

Alternatively, the capacitor 36 can be replaced by other suitable RF matching means (such as a capacitor and shunt element in series or a transformer) as determined by the impedance transfer characteristics required within the RF power amplifier.

The external control loop includes a d.c. current detector 42 which is connected to the RF power amplifier at the collector electrode of both the driver transistor 34 and the output transistor 38. The d.c. current detector 42 and a reference current 46 are coupled to a regulator 44, which regulator 44 is coupled to a bias control signal generator 48. The external control loop further comprises a connection from the bias control signal generator 48 to each of the base electrode of the driver transistor 34 and the base electrode of the output transistor 38.

The protection circuit comprises a voltage envelope detector 50 and a protection level reference 52 both coupled to a bias reduction circuit 54. The voltage envelope detector 50 is connected to the collector electrode of the output transistor 38 and also, the bias reduction circuit 54 is connected to the base electrode of the driver transistor 34.

In operation, the RF power amplifier functions in a similar manner to the RF power amplifier 10 of FIG. 1. The d.c. current detector 42 detects any voltage swing (resulting from an impedance variation on the RF load 40) at the collector electrode of the output transistor 38.

The d.c. current detector 42 detects the d.c. current at the collector electrode of the output transistor 38. Generally, any alteration in this current is caused by an impedance variation on the RF load 40. The detected current is output from the d.c. current detector 42 and fed to the regulator 44 which processes the detected current in combination with the reference current 46. Where the detected current is lower than a predetermined threshold the regulator 44 produces a higher regulated output current and when the detected current is higher than a predetermined threshold the regulator 44 produces a lower regulated output current. The regulated output current is fed to the bias control signal generator 48 which provides a suitable bias current to the driver transistor 34 and the output transistor 38 to compensate for any impedance variation on the RF load 40.

The voltage envelope detector 50 detects the voltage envelope at the collector electrode of the output transistor 38. This signal is processed, in combination with a protection level reference signal 52, in the bias reduction circuit 54. The resulting signal is fed to the base electrode of the driver transistor 34 to ensure that a voltage swing at the output transistor 38 does not reach an excessive level.

Figure 3:
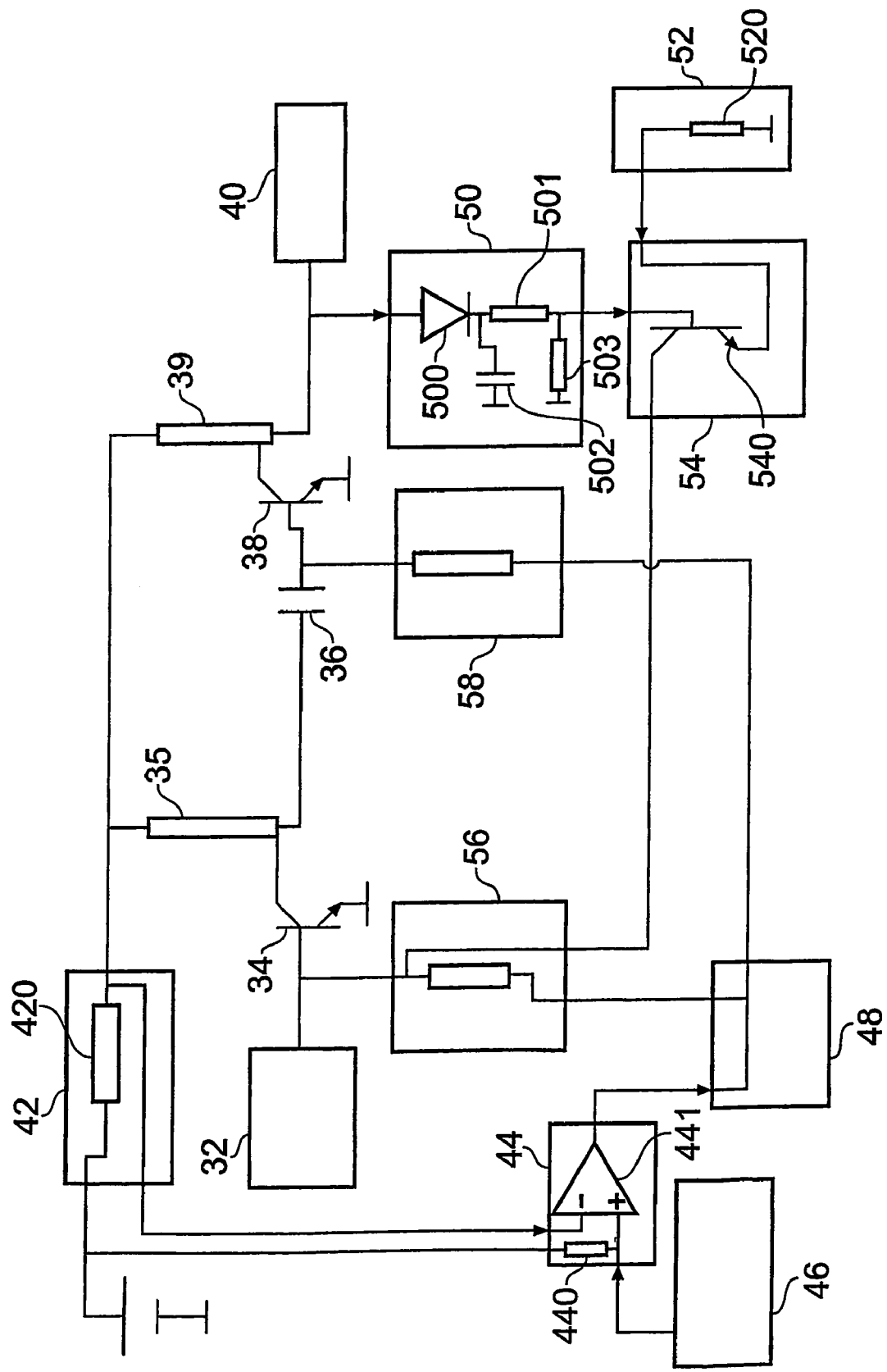
FIG. 3 is a schematic diagram showing the RF power amplifier of FIG. 2 in greater detail.

FIG. 3 illustrates the RF power amplifier of FIG. 2 in greater detail, but common reference numerals are employed where common elements are illustrated. Specifically, additional detail can be found where a first choke element 35 and a second choke element 39 are coupled between the d.c. current detector 42 and the driver transistor 34 and the output transistor 38, respectively.

In the external control loop, the d.c. current detector 42 includes a resistor 420 connected to the input line from the regulator 44. The regulator 44 is shown to include a resistor 440 and an AND gate 441.

In the protection circuit, the voltage envelope detector 50 includes a diode 500 and a first resistor 501 connected in series. A capacitor 502 is coupled between the output of the diode 500 and ground, and a second resistor 503 is coupled between the output of the first resistor 501 and ground. The protection level reference 52 includes a resistor 520 coupled between ground and the protection level reference output. This output is connected to an emitter electrode of a transistor 540 located within the bias reduction circuit 54. Additionally, a first resistor block 56 connected to the base electrode of driver transistor 34 and a second resistor block 58 connected to the base electrode of output transistor 38, are illustrated.

The operation of the circuit of FIG. 3 is described above, in relation to FIG. 2.

Figure 4:
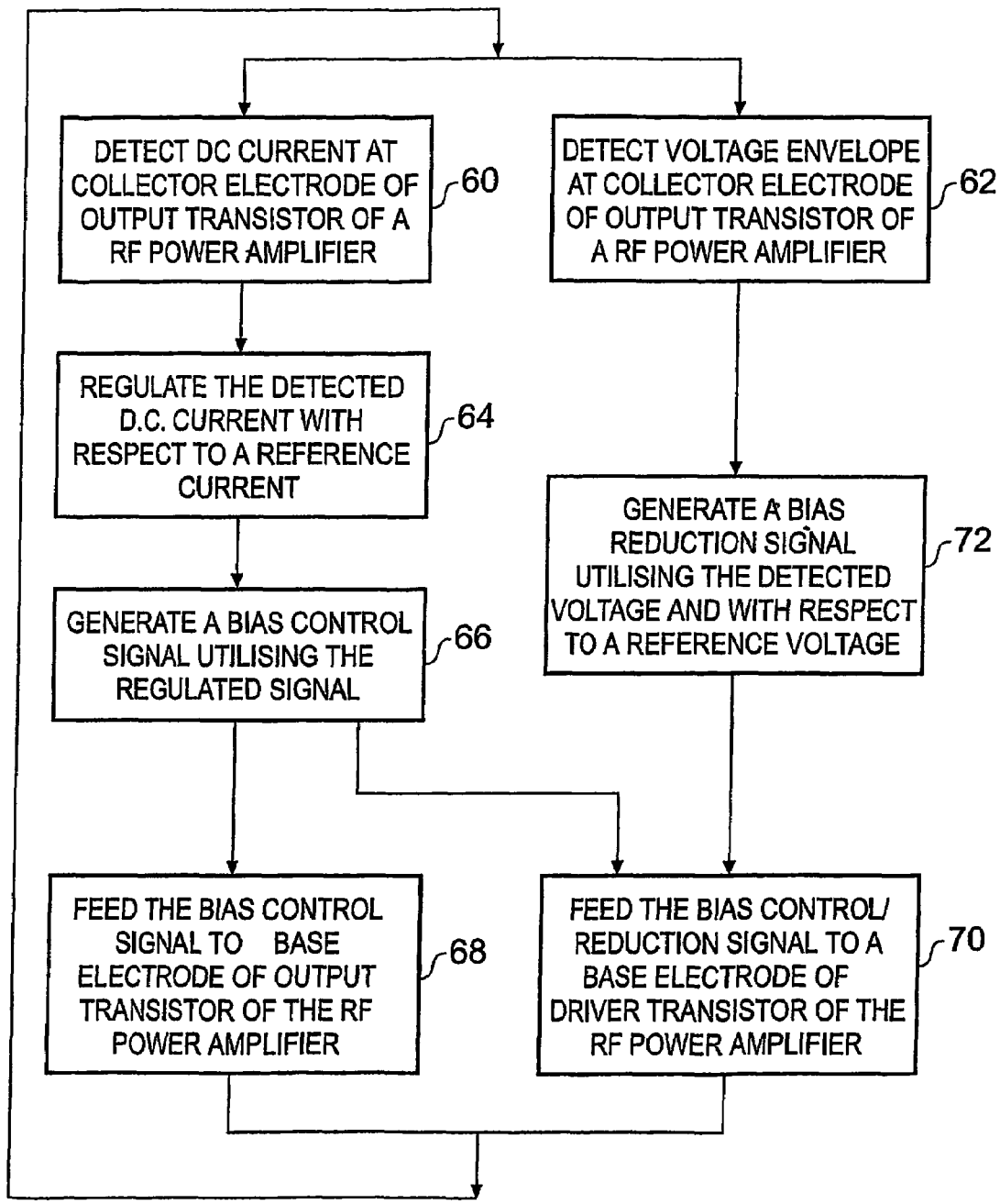
FIG. 4 is a flow chart showing the operational stages of the present invention.

As shown in FIG. 4, the first stages of operation of the present invention involve the detection 60 62 of two parameters (namely the d.c. current and the voltage envelope) at the collector electrode of the output transistor. The detected d.c. current is regulated 64 with respect to a reference current and then a bias control signal is generated 66 utilising the regulated signal. A control loop is completed when the bias control signal is fed 68 70 to the base electrode of each of the output transistor and the driver transistor.

Returning to the detected voltage envelope, a bias signal is generated 72 utilising the detected voltage envelope with respect to a reference voltage. A protection function is performed when the bias reduction signal is fed 70 to a base electrode of the driver transistor. Both the control loop function and the protection function are performed on a continuous basis during the operation of the RF power amplifier.

It will be apparent to the skilled person that the above described circuit architecture is not exhaustive and variations on this structure may be employed to achieve a similar result whilst employing the same inventive concept.

It can therefore be seen that the present invention provides a power amplification circuit which has significant advantages over conventional devices.

The invention claimed is:

1. A method of controlling output from a power amplifier which has a driver stage and an output stage, the method comprising: detecting a first and a second electrical parameter at an output of the output stage, wherein the first electrical parameter is an electrical current;

processing the first parameter with a first reference signal to generate a bias control signal;

processing the second parameter with a second reference signal to generate a bias reduction signal:

feeding the bias control signal to an input of both the driver and the output stages: and feeding the bias reduction signal to an input of the driver stage.

2. A method of controlling output from a power amplifier which has a driver stage and an output stage, the method comprising: detecting a first and a second electrical parameter at an output of the output stage, wherein the second electrical parameter is an output voltage envelope;

processing the first parameter with a first reference signal to generate a bias control signal;

processing the second parameter with a second reference signal to generate a bias reduction signal:

feeding the bias control signal to an input of both the driver and the output stages: and feeding the bias reduction signal to an input of the driver stage.

3. A method of controlling output from a power amplifier which has a driver stage and an output stage, the method comprising: detecting a first and a second electrical parameter at an output of the output stage, wherein the first electrical parameter is an electrical current and the second electrical parameter is an output voltage envelope;

processing the first parameter with a first reference signal to generate a bias control signal;

processing the second parameter with a second reference signal to generate a bias reduction signal:

feeding the bias control signal to an input of both the driver and the output stages: and feeding the bias reduction signal to an input of the driver stage.

4. An electrical circuit comprising:

a power amplifier, having a driver stage and an output stage;

an external control loop; and a protection circuit, having:

a detection means coupled to the output of the output stage for detecting a first and a second electrical parameter at an output of the power amplifier, wherein said first electrical parameter is an electrical current; and a bias reduction means coupled to the input of the driver stage for providing a bias signal at an input of the power amplifier and a reference signal generator coupled to the bias reduction means.

5. The electrical circuit of claim 4, for use in a mobile telecommunications device.

6. An electrical circuit comprising:

a power amplifier, having a driver stage and an output stage;

an external control loop; and a protection circuit, having:

a detection means coupled to the output of the output stage for detecting a first and a second electrical parameter at an output of the power amplifier, wherein the second electrical parameter is an output voltage envelope; and a bias reduction means coupled to the input of the driver stage for providing a bias signal at an input of the power amplifier and a reference signal generator coupled to the bias reduction means.

7. The electrical circuit of claim 6, for use in a mobile telecommunications device.

8. An electrical circuit comprising:

a power amplifier, having a driver stage and an output stage;

an external control loop; and a protection circuit, having:

a detection means coupled to the output of the output stage for detecting a first and a second electrical parameter at an output of the power amplifier, wherein the first electrical parameter is an electrical current and the second electrical parameter is an output voltage envelope; and a bias reduction means coupled to the input of the driver stage for providing a bias signal at an input of the power amplifier and a reference signal generator coupled to the bias reduction means.

9. The electrical circuit of claim 8, for use in a mobile telecommunications device.

* * * * *

UNITED STATES PATENT AND TRADEMARK OFFICE
CERTIFICATE OF CORRECTION

| | | |
|---|---|---|
| PATENT NO. | : 7,330,072 B2 | Page 1 of 1 |
| APPLICATION NO. | : 10/522913 | |
| DATED | : February 12, 2008 | |
| INVENTOR(S) | : Brandt | |

It is certified that error appears in the above-identified patent and that said Letters Patent is hereby corrected as shown below:

Title Page, Item (51), under "Int. Cl.", in Column 1, Line 1, delete "H03Q" and insert -- H03G --, therefor.

In Column 4, Line 39, delete "60" and insert -- 60, --, therefor.

In Column 4, Line 45, delete "68" and insert -- 68, --, therefor.

In Column 5, Line 4, in Claim 1, delete "signal:" and insert -- signal; --, therefor.

In Column 5, Line 6, in Claim 1, delete "stages:" and insert -- stages; --, therefor.

In Column 5, Line 17, in Claim 2, delete "signal:" and insert -- signal; --, therefor.

In Column 5, Line 19, in Claim 2, delete "stages:" and insert -- stages; --, therefor.

In Column 5, Line 31, in Claim 3, delete "signal:" and insert -- signal; --, therefor.

In Column 5, Line 33, in Claim 3, delete "stages:" and insert -- stages; --, therefor.

Signed and Sealed this

Fourteenth Day of October, 2008

JON W. DUDAS
*Director of the United States Patent and Trademark Office*